(12) United States Patent
Jeong

(10) Patent No.: US 9,412,524 B2
(45) Date of Patent: Aug. 9, 2016

(54) METHOD FOR FORMING CONDUCTIVE ELECTRODE PATTERNS AND METHOD FOR MANUFACTURING SOLAR CELLS COMPRISING THE SAME

(71) Applicant: Hyundai Motor Company, Seoul (KR)

(72) Inventor: Kyoung Jin Jeong, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/476,010

(22) Filed: Sep. 3, 2014

(65) Prior Publication Data

US 2015/0140727 A1    May 21, 2015

(30) Foreign Application Priority Data

Nov. 15, 2013  (KR) .................. 10-2013-0138992

(51) Int. Cl.
  *H01L 21/00* (2006.01)
  *H01G 9/20* (2006.01)

(52) U.S. Cl.
  CPC ........... *H01G 9/2068* (2013.01); *H01G 9/2031* (2013.01); *Y02B 10/12* (2013.01); *Y02E 10/542* (2013.01)

(58) Field of Classification Search
  CPC ..................... H01G 9/2031; H01G 9/2059
  See application file for complete search history.

(56) References Cited

U.S. PATENT DOCUMENTS

| | | | | |
|---|---|---|---|---|
| 6,878,260 | B2 * | 4/2005 | Huang | C25D 5/024 205/118 |
| 6,995,391 | B2 * | 2/2006 | Alvarado et al. | 257/40 |
| 8,022,291 | B2 * | 9/2011 | Thomsen et al. | 136/256 |
| 8,076,571 | B2 * | 12/2011 | den Boer et al. | 136/265 |
| 2006/0154034 | A1 * | 7/2006 | Araki | 428/209 |
| 2008/0035965 | A1 * | 2/2008 | Hayashi et al. | 257/291 |
| 2011/0277825 | A1 | 11/2011 | Fu et al. | |
| 2013/0049008 | A1 * | 2/2013 | Jeong | 257/76 |
| 2013/0180586 | A1 * | 7/2013 | Maehara | 136/256 |
| 2014/0007936 | A1 * | 1/2014 | Kim et al. | 136/256 |
| 2014/0053897 | A1 * | 2/2014 | Balasubramanian | H01L 27/302 136/255 |
| 2014/0102540 | A1 * | 4/2014 | Kobayashi et al. | 136/263 |
| 2014/0166613 | A1 * | 6/2014 | Doll et al. | 216/13 |
| 2014/0239288 | A1 * | 8/2014 | Delcamp et al. | 257/40 |

FOREIGN PATENT DOCUMENTS

| | | |
|---|---|---|
| JP | 60-183776 A | 9/1985 |
| JP | 2000-277768 A | 10/2000 |
| JP | 2004-266023 A | 9/2004 |
| KR | 10-2005-0097263 | 10/2005 |
| KR | 10-2007-0047089 | 5/2007 |
| KR | 10-2011-0008873 | 1/2011 |
| KR | 10-2011-0043147 | 4/2011 |
| KR | 10-2012-0137929 | 12/2012 |
| KR | 10-2013-0035331 | 4/2013 |

* cited by examiner

*Primary Examiner* — Zandra Smith
*Assistant Examiner* — André C Stevenson
(74) *Attorney, Agent, or Firm* — Mintz Levin Cohn Ferris Glovsky and Popeo, P.C.; Peter F. Corless

(57) ABSTRACT

A method for forming conductive electrode patterns of a solar cell is provided. The method includes preparing a glass substrate and forming a transparent conductive oxide film (TCO) on the glass substrate. Then, a titanium oxide ($TiO_2$) layer and a silver (Ag) electrode are formed on the glass substrate. A nickel (Ni) layer is formed on the Ag electrode and a copper (Cu) layer is formed on the Ni layer. In addition, a tin (Sn) layer is formed on the Cu layer.

23 Claims, 9 Drawing Sheets

METHOD FOR FORMING CONDUCTIVE ELECTRODE PATTERNS AND METHOD FOR MANUFACTURING SOLAR CELLS COMPRISING THE SAME

CROSS-REFERENCE TO RELATED APPLICATION

This application claims under 35 U.S.C. §119(a) the benefit of Korean Patent Application No. 10-2013-0138992 filed on Nov. 15, 2013, the entire contents of which are incorporated herein by reference.

BACKGROUND (a) Technical Field

The present disclosure relates to a method for forming conductive electrode patterns of a solar cell without increasing electric resistance of the conductive electrode patterns due to the decrease in a line width of the electrode patterns.

(b) Background Art

Generally, solar cells have been fabricated using a different structure depending on the type of solar cell. These different types of solar cells (e.g., silicon solar cells, semiconductor solar cells, OPV, DSC and the like) commonly include the formation of a conductive electrode using generated electrons. The conductive electrode has been widely formed using a screen printing method using a silver (Ag) paste.

However, such a screen printing method employs Ag which is a relatively expensive metal ion, which increases the production cost of solar cells. In particular, since the conductive electrode patterns of a solar cell are formed in a substantially thin line width, the thickness of the conductive electrode patterns should be increased to secure electric conductivity of the conductive electrode patterns. Accordingly, the thickness of the conductive electrode patterns has been currently increased by repeatedly printing an Ag paste on the same area of a silicon substrate or a glass substrate. Therefore, the conventional methods for forming conductive electrode patterns of a solar cell require the repetitive use of Ag, thus increasing the production cost of solar cells.

In addition, since such a screen printing method applies physical pressure to a silicon substrate or a glass substrate, damage may occur to the substrate. In particular, as the need for integration of solar cells and cost reduction has been gradually increased, there are efforts to reduce the unit cost of a silicon substrate based on the production costs of solar cells. To reduce the unit cost of a silicon substrate, the thickness thereof should be decreased.

Furthermore, for dye sensitized solar cells that use a glass substrate, a substantially thin plate substrate with a thickness of about 1 t or less should be used to fit curved surfaces. However, as the thickness of the glass substrate decreases, breakage risk of the glass substrate increases due to physical pressure during the above mentioned screen printing procedure, and thus, the reduction of the thickness of the glass substrate for the formation of a conductive electrode is limited. Currently, when the conductive electrode patterns are formed using the screen printing method, the minimum thickness required to prevent the glass substrate from being damaged due to physical pressures is known to be about 100 to 180 μm.

Moreover, another known method for forming an electrode of a heterojunction solar cell, includes forming a seed layer on the front and the rear of a transparent conducting oxide (TCO) layer after the manufacturing process of a solar cell is progressed before the formation of an electrode, followed by patterning of the seed layer. Another known method discloses a thin film type solar cell and a manufacturing method thereof, which is characterized by forming an optical transmitting thin film on a crystalline silicon wafer to increase optical transmittance and decreasing specific resistance.

Yet another known method includes a transparent electrode for a solar cell that includes a transparent substrate, a photocatalyst layer formed on the transparent substrate with a photocatalyst compound, a metal mesh layer formed on the photocatalyst layer, and a conductive layer formed on the metal mesh layer by coating a conductive material, and a manufacturing method thereof. Other known method disclose that for the fabrication of a solar cell, printing an Ag grid with larger cross sections (e.g., thicker Ag layer) may decrease the series resistance. However, such an approach requires multiple printing steps, thereby not only adding production complexity, but also requiring the consumption of more Ag.

Many attempts to improve efficiency of a silicon solar cell with reducing the cost production have been made, and such a technical trend is commonly applied to the fabrication of compound solar cells, organic photovoltaic (OPV) cells, dye sensitized solar cells (DSC) and the like. In the formation of conductive electrode patterns that are a core component of a solar cell, decreasing a line width of the conductive electrode patterns is an important issue for improving energy conversion efficiency of a solar cell. However, as the line width of the conductive electrode patterns decreases, the electric resistance thereof increases, causing a decrease in electrode performance. Therefore, the conductive electrode patterns of solar cells should satisfy the requirements for a fine line width and high electrical conductivity.

Currently, the screen printing method has been widely used to form the conductive electrode patterns of a solar cell, which prints an Ag paste at an electrode area on a silicon substrate. However, such a screen printing method using an Ag paste requires the use of an expensive metal ion, Ag, thus increasing the production costs of a solar cell. In addition, for a dye sensitized solar cell, an Ag electrode may be contaminated by an electrolyte used therein, which may result in lowering the performance of the solar cell.

The above information disclosed in this section is merely for enhancement of understanding of the background of the invention and therefore it may contain information that does not form the prior art that is already known in this country to a person of ordinary skill in the art.

SUMMARY

The present invention provides manufacturing techniques of a solar cell that may decrease the amount of an Ag paste used, reduce the production cost for the formation of conductive electrode patterns, improve conductivities within the same, and prevent performance degradation due to the contamination of an Ag electrode.

In one aspect, the present invention provides a method for manufacturing a solar cell that may include a different metal layer on a silver electrode as a conductive electrode, which may include the following steps: a) preparing a glass substrate; b) forming a transparent conductive oxide film (TCO) on the glass substrate; c) forming a titanium oxide ($TiO_2$) layer on the glass substrate; d) forming an Ag electrode on the glass substrate; e) forming a nickel (Ni) layer on the Ag electrode; f) forming a copper (Cu) layer on the Ni layer formed on the Ag electrode; and g) forming a tin (Sn) layer on the Cu layer formed on the Ni layer which is formed on the Ag electrode, wherein the forming of the nickel layer on the Ag electrode may include forming a coating of a different metal using the Ag electrode as a seed. In an exemplary embodiment, the Ag electrode of steps e) through g) may be a tantalum (Ta) plated Ag electrode.

In another exemplary embodiment, the glass substrate may have a thickness of about 1 t or less. In addition, the transparent conductive oxide film may have a thickness of about 1000 A or less and may include at least one layer selected from a group consisting of fluorine tin oxide, indium tin oxide, indium zinc oxide, indium tungsten oxide and zinc oxide (ZnO), but is not limited thereto and may also include boron doped zinc oxide (ZnO:B), aluminum doped zinc oxide (ZnO:Al), hydrogen doped zinc oxide (ZnO:H), fluorine doped tin oxide ($SnO_2$:F), tin oxide ($SnO_2$) as necessary as known to one of ordinary skill in the art.

Further, the transparent conductive film may have a metal mesh pattern. The $TiO_2$ layer may have a thickness of about 1 to 20 um and may be formed by a coating method selected from a group consisting of screen printing, dispenser printing, ink jet printing, roll printing, gravure printing and spin coating. In addition, the $TiO_2$ layer may be formed at the front of the substrate or the front of the transparent conductive film except for the space where a collecting electrode is formed.

The formed Ag electrode may have a thickness of about 1 to 10 um, a bell shape with a bulged upper portion, and may be formed by a coating method selected from a group consisting of screen printing, dispenser printing, ink jet printing, roll printing, gravure printing and spin coating. In addition, the surface of the transparent conductive film may be coated with a Fluoro-based liquid material or may be subjected to plasma pretreatment with Fluoro-based gas before the formation of an Ag electrode.

Furthermore, the forming of the Ni layer may be performed by a plating method using electroplating, electroless plating or LIP (light induced plating). The forming of the copper layer may be performed by a plating method using electroplating, electroless plating or LIP; or a coating method of screen printing, dispenser printing, ink jet printing, roll printing or gravure printing, or spin coating. The formation of the tin layer may be performed by a plating method using electroplating, electroless plating or LIP; or a coating method of screen printing, dispenser printing, ink jet printing, roll printing or gravure printing, or spin coating.

In addition, the method may include forming a tantalum (Ta) layer on the Sn layer (step (h)). The formation of the tin layer may be replaced with step g-1) forming a Ta layer on the Sn layer rather than the Cu layer, and step h) may be replaced with h-1) forming a Sn layer on the Ta layer.

Moreover, the solar cell having a different metal layer on a silver electrode as a conductive electrode manufactured by the method may be used to manufacture a semi-transparent solar cell module for a panorama roof. The solar cell that has a different metal layer on a silver electrode as a conductive electrode manufactured by the method may be used to manufacture a dye-sensitized solar cell.

In another aspect, the present invention provides a method for manufacturing a solar cell having a different metal layer on a silver electrode as a conductive electrode, which may include the following steps: a) preparing a glass substrate; b) forming a transparent conductive oxide film (TCO) on the glass substrate; c) forming an anti-plating layer on the transparent conductive oxide film (TCO) formed on the glass substrate; d) forming an Ag electrode between the areas of the anti-plating layer; e) forming a Ni layer on the Ag electrode (e.g., plating of a different metal using an Ag electrode as a seed); f) forming a Cu layer on the Ni layer formed on the Ag electrode; g) forming a Sn layer on the Cu layer formed on the Ni layer which may be formed on the Ag electrode; and h) removing the anti-plating layer. In an exemplary embodiment, the method may further include i) forming a $TiO_2$ layer on the area where the anti-plating layer is removed. The method may also further include g-1) forming a Ta layer on the Sn layer.

The glass substrate may have a thickness of about 1 t or less. The formation of the nickel layer may include forming a coating of a different metal using the Ag electrode as a seed. The formation of the Sn layer may be performed by g) forming a Ta layer rather than a Sn layer on the Cu layer, and g-1) forming a Sn layer on the Ta layer. In an exemplary embodiment, the Ag electrode of steps e) through g) may be a Ta plated Ag electrode.

The transparent conductive oxide film may have a thickness of about 1000 A or less and may include at least one layer selected from a group consisting of fluorine tin oxide, indium tin oxide, indium zinc oxide, indium tungsten oxide and ZnO. In another embodiment, the transparent conductive oxide film may include the above materials and may have a metal mesh pattern.

Furthermore, the anti-plating layer may be formed using ink jet printing, screen printing, roll printing or gravure printing, followed by being hardened through ultraviolet (UV) curing or heat curing. The anti-painting layer may be formed as a pattern at the area except for the area where the Ag electrode is formed. In addition, the anti-plating layer may be formed using a coating method of gravure printing or spin coating. The $TiO_2$ layer may function as an anti-plating layer.

The Ag electrode may have a thickness of about 1 to 20 um, have a bell shape with a bulged upper portion, and may be formed by a coating method selected from a group consisting of screen printing, dispenser printing, ink jet printing, roll printing, gravure printing and spin coating. Notably, the formation of the anti-plating layer and the Ag electrode may be formed in reverse order.

In another exemplary embodiment, the surface of the transparent conductive oxide film may be coated with a Fluoro-based liquid material or may be subjected to plasma pretreatment with Fluoro-based gas before the formation of an Ag electrode. The method may further include forming a plurality of patterns (e.g., 2 to 5 patterns) for plating at a bus line in the bottom during the formation of the Ag electrode.

Moreover, the formation of the Ag electrode may be performed by a plating method using electroplating, electroless plating or LIP (light induced plating). The Cu layer formation may be performed by a plating method using electroplating, electroless plating or LIP; or a coating method of screen printing, dispenser printing, ink jet printing, roll printing or gravure printing, or spin coating. The Sn layer formation may be performed by a plating method using electroplating, electroless plating or LIP; or a coating method of screen printing, dispenser printing, ink jet printing, roll printing or gravure printing, or spin coating. In addition, the anti-plating layer may be removed using an acidic, a neutral or an alkaline stripping solution.

In another further exemplary embodiment, the $TiO_2$ layer may have a thickness of about 1 to 20 um and may be formed by a coating method selected from a group consisting of screen printing, dispenser printing, ink jet printing, roll printing, gravure printing and spin coating. The $TiO_2$ layer may be formed at the front of the substrate or the front of the transparent conductive oxide film except for the area at which a collecting electrode is formed.

Accordingly, the solar cell having a different metal layer on a silver electrode as a conductive electrode manufactured by the method may be used to manufacture a semi-transparent solar cell module for a panorama roof and to manufacture a dye-sensitized solar cell.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
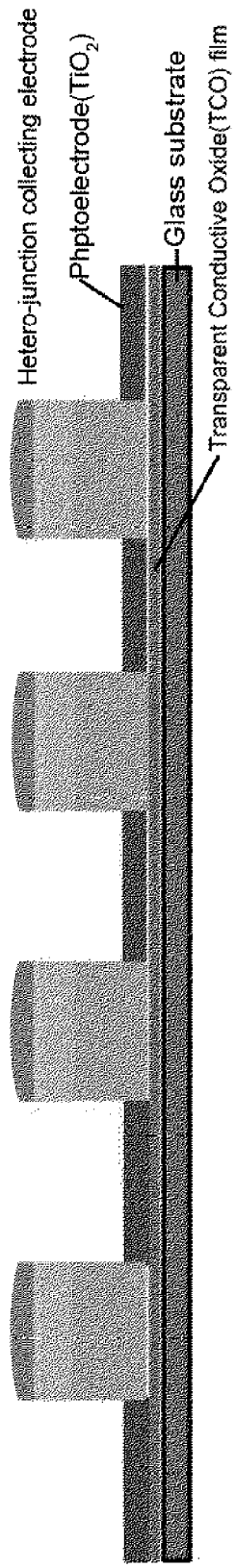
FIG. 1 is an exemplary structural section of a solar cell fabricated according to the exemplary embodiment of the present invention.

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

The present invention provides a method for manufacturing a solar cell having a different metal layer on a silver electrode as a conductive electrode, which may include preparing a glass substrate; forming a transparent conductive oxide film (TCO) on the glass substrate; forming a $TiO_2$ layer on the glass substrate; forming an Ag electrode on the glass substrate; forming a Ni layer on the Ag electrode; forming a Cu layer on the Ni layer formed on the Ag electrode; and forming a Sn layer on the Cu layer formed on the Ni layer which may be formed on the Ag electrode. The formation of the Ni layer may include forming a coating of a different metal using the Ag electrode as a seed.

In addition, the present invention provides a method for manufacturing a solar cell having a different metal layer on a silver electrode as a conductive electrode, which may include: preparing a glass substrate; forming a transparent conductive oxide film (TCO) on the glass substrate; forming an anti-plating layer on the transparent conductive oxide film (TCO) formed on the glass substrate; forming an Ag electrode between the areas of the anti-plating layer; forming a Ni layer on the Ag electrode (e.g., plating of a different metal using an Ag electrode as a seed); forming a Cu layer on the Ni layer formed on the Ag electrode; forming a Sn layer on the Cu layer formed on the Ni layer formed on the Ag electrode; and removing the anti-plating layer. The Ni layer formation may include forming a coating of a different metal using the Ag electrode as a seed.

In an exemplary embodiment, the present invention may include a method of directly forming a different metal electrode on an Ag electrode without a masking layer. FIG. 1 is an exemplary section of a solar cell structure manufactured according to the method of the present invention described above.

A hetro-junction collecting electrode may be in the form of Ag—Ni—Cu—Sn; Ag—Ni—Cu—Sn—Ta; Ag—Ni—Cu—Ta—Sn; or Ag—Ta. The electrode may be selected from the above constitutions and is not limited to a particular order. Especially, the present invention provides a method for forming a metal layer with a structure as illustrated in FIG. 1, which may include: preparing a glass substrate; forming a transparent conductive oxide film (TCO) on the glass substrate; forming a $TiO_2$ layer on the glass substrate; forming an Ag electrode on the glass substrate; forming a Ni layer on the Ag electrode (e.g., plating of a different metal using an Ag electrode as a seed); forming a Cu layer on the Ni layer formed on the Ag electrode; and forming a Sn layer on the Cu layer formed on the Ni layer formed on the Ag electrode.

In particular, the glass substrate may have a thickness of about 1 t or less. The transparent conductive oxide film may have a thickness of about 1000 A or less, and may include at least one layer selected from a group consisting of fluorine tin oxide, indium tin oxide, indium zinc oxide, indium tungsten oxide and ZnO. In addition, the transparent conductive oxide film may be include a metal mesh pattern. When the transparent conductive oxide film is a metal mesh patter, surface resistance of the transparent conductive oxide film may be reduced and contact resistance between the transparent conductive oxide film and the electrode may be reduced.

Furthermore, the formed $TiO_2$ layer may have a thickness of about 1 to 20 um, and may be formed by a coating method of screen printing, dispenser printing, ink jet printing, roll printing, gravure printing. The $TiO_2$ layer may be formed at the front of the glass substrate or the front of the transparent conductive oxide film except for the space where a collecting electrode is formed. The Ag electrode may have a thickness of about 1 to 10 um, may have a bell shape with a bulged upper portion, and may be formed by a coating method selected from a group consisting of screen printing, dispenser printing, ink jet printing, roll printing, gravure printing and spin coating.

In one embodiment, before the formation of the Ag electrode, the transparent conductive oxide film may be coated with a Fluoro-based liquid material or be subjected to plasma pretreatment with Fluoro-based gas. Through such a plasma treatment, surface cleaning effects or pre-treatment effects by micro-etching may be expected, that is, an effect of improving adhesive strength between the electrode and the transparent electrode. This process may be performed before the formation of the Ag electrode or after the formation of the $TiO_2$ layer.

Further, the Ni layer may be formed by a plating method using electroplating, electroless plating or LIP (light induced plating: a process capable of plating only with light irradiation). The Cu layer may be formed by a plating method using electroplating, electroless plating or LIP; or a coating method of screen printing, dispenser printing, ink jet printing, roll printing or gravure printing, or spin coating. In addition, the Sn layer may be formed by a plating method using electroplating, electroless plating or LIP; or a coating method of screen printing, dispenser printing, ink jet printing, roll printing or gravure printing, or spin coating.

The method of the present invention may further include forming a Ta layer on the Sn layer. Alternatively, the method of the present invention may be performed by forming a Ta layer rather than the Sn layer on the Cu layer, and forming a Sn layer on the Ta layer.

Figure 2:
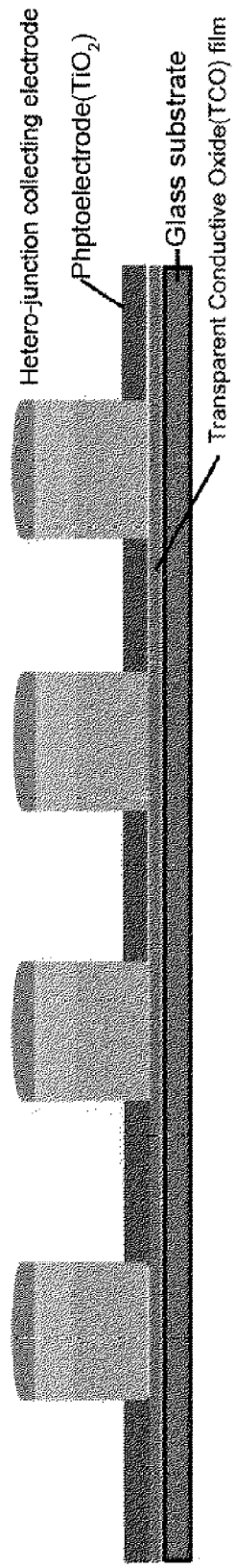
FIG. 2 is an exemplary section of an electrode with a structure in which a masking layer is formed, followed by directly forming an electrode of a different metal layer on the Ag electrode according to an exemplary embodiment of the present invention.
Figure 3:
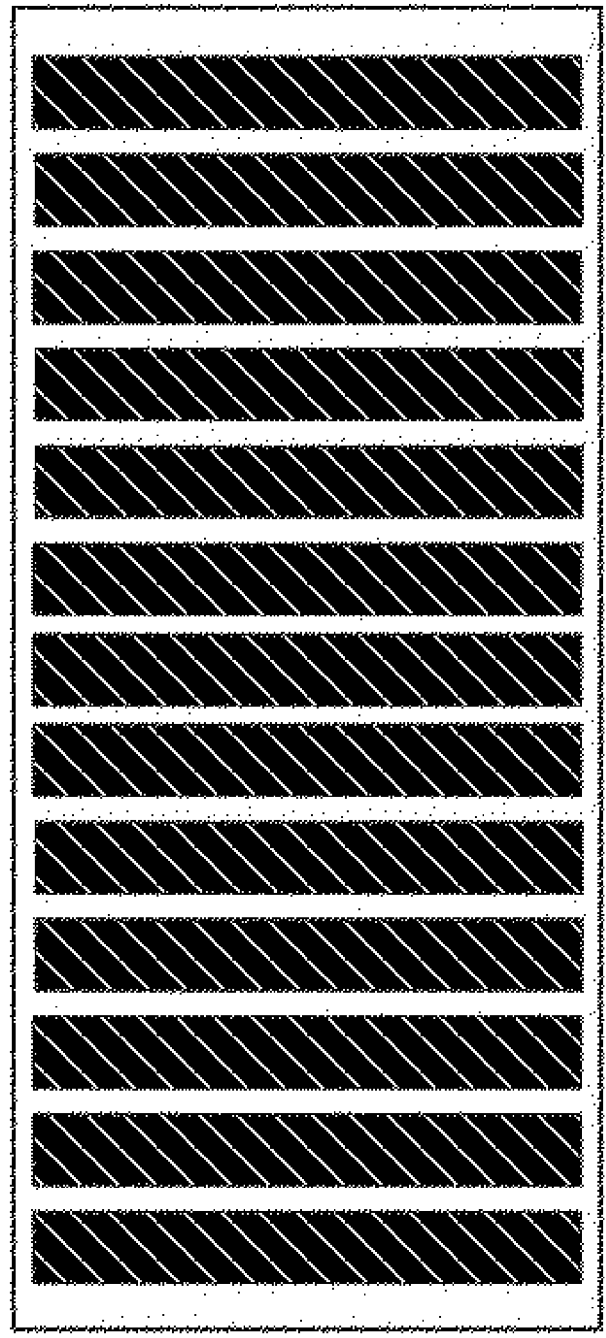
FIG. 3 is an exemplary shape of anti-painting layers formed on a transparent conductive oxide film (TCO) according to an exemplary embodiment of the present invention.

In another exemplary embodiment, the present invention provides a method of using an anti-painting layer as illustrated in FIG. 3, (i.e., a method of forming a masking layer followed by directly forming an electrode of a different metal layer (FIG. 2) on the Ag electrode). Hetero-junctioned collecting electrode may be in the form of Ag—Ni—Cu—Sn; Ag—Ni—Cu—Sn—Ta; Ag—Ni—Cu—Ta—Sn; or Ag—Ta. The electrode may be selected from the above constitutions and is not limited to a particular order.

Figure 4:
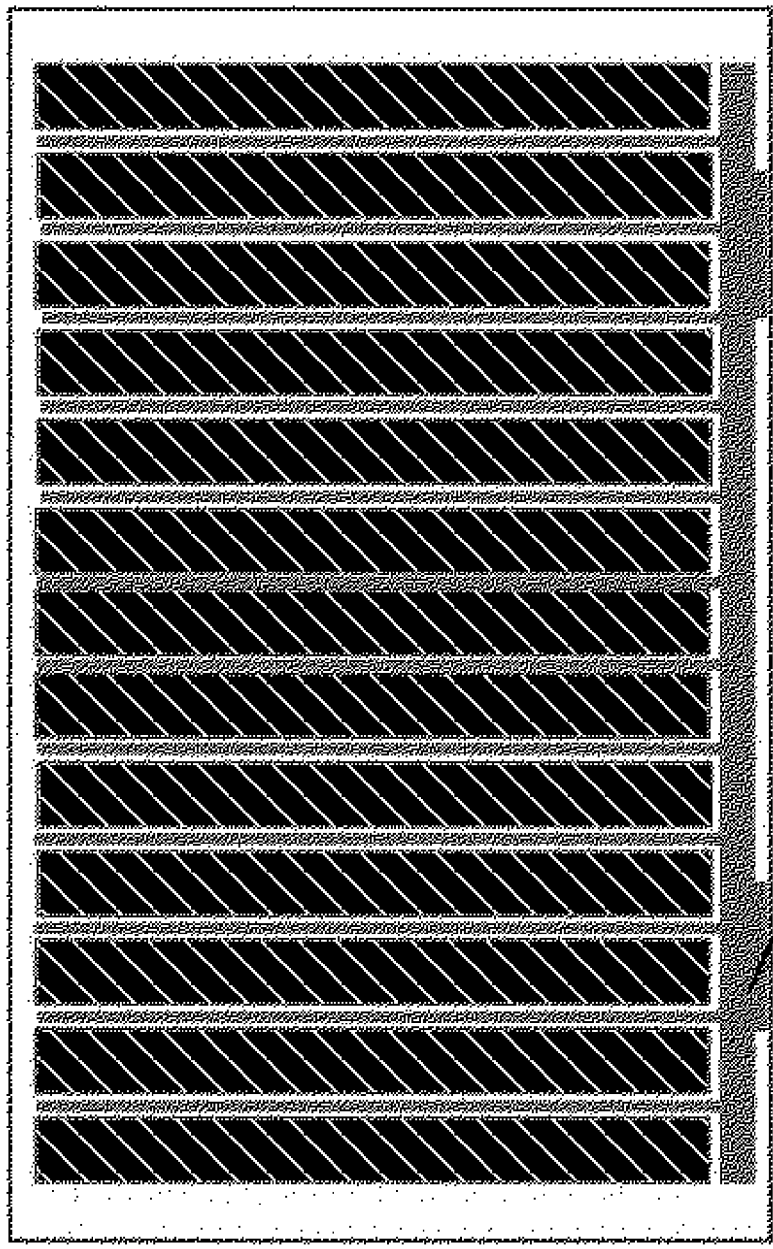
FIG. 4 is an exemplary shape of an Ag electrode formed between the anti-plating layers according to an exemplary embodiment of the present invention.

FIG. 2 shows an exemplary section of a solar cell structure manufactured by the above method. In particular, the present invention provides a method for forming a metal layer on an Ag electrode in the form as represented by FIG. 4, which may include: preparing a glass substrate; forming a transparent conductive oxide film (TCO) on the glass substrate; forming an anti-plating layer on the transparent conductive oxide film (TCO) formed on the glass substrate; forming an Ag electrode between the areas of the anti-plating layer; forming a Ni layer on the Ag electrode (e.g., plating of a different metal using an Ag electrode as a seed); forming a Cu layer on the Ni layer formed on the Ag electrode; forming a Sn layer on the Cu layer formed on the Ni layer formed on the Ag electrode; and removing the anti-plating layer.

The above method may further include forming a $TiO_2$ layer on the area where the anti-plating layer is removed. In addition, the glass substrate may have a thickness of about 1 t or less. The method may also further include forming a Ta layer on the Sn layer. Alternatively, the method may be performed by forming a Ta layer rather than a Sn layer on the Cu layer, and forming a Sn layer on the Ta layer.

Furthermore, the transparent conductive oxide film may have a thickness of about 1000 A or less, and may include at least one layer selected from a group consisting of fluorine tin oxide, indium tin oxide, indium zinc oxide, indium tungsten oxide and ZnO. The transparent conductive oxide film may include the above ingredients and may have a metal mesh pattern. When the transparent conductive oxide film is formed in a metal mesh pattern surface resistance of the transparent conductive oxide film and contact resistance between the transparent conductive oxide film and the electrode may be reduced.

The anti-painting layer may be formed using a coating method of ink jet printing, screen printing, roll printing or gravure printing, and is characterized by being hardened through UV curing or heat curing after the formation is completed. The anti-painting layer may be formed in a pattern at the area except for the area where the Ag electrode is formed and may be formed using a coating method of gravure printing or spin coating.

The function of the anti-plating layer may be replaced with the $TiO_2$ layer. In other words, the method may be progressed without forming the anti-plate layer. Since $TiO_2$ belonging to ceramic is non-conductor and does not cause plating, the $TiO_2$ layer may be used as an anti-plating layer.

Moreover, the Ag electrode may have a thickness of about 1 to 20 um, have a bell shape with a bulging upper portion, and may be formed by a coating method of screen printing, dispenser printing, ink jet printing, roll printing, gravure printing or spin coating. The process of forming the Ag electrode may be reversed with the formation of the forming of the anti-plate layer. Before the formation of the Ag electrode, the transparent conductive oxide film may be coated with a fluoro-based liquid material or be subjected to plasma pretreatment with fluoro-based gas. Through such a plasma treatment, surface cleaning effects or pre-treatment effects by micro-etching may be expected, that is, an effect of improving adhesive strength between the electrode and the transparent electrode.

During the formation of an Ag electrode, a plurality of patterns (e.g., 2 to 5 patterns) for plating may be further formed at the bottom of a bus line. The bus line may function as a current collector that gathers electrons generated at the electrode. Generally, for crystalline solar cells, a 5-inch wafer may include 2 bus lines and a 6-inch wafer may include 3 bus lines. This is intended to form an additional pattern to pick up an electrode for plating (e.g., to be charged with electricity) in a protruded shape at the bus line usually contained in the solar cell. In other words, for the effective plating, a contact point where electricity is charged from a plating solution, and thereby, plated materials may be transferred should be provided, the separate pattern for painting may be additionally formed along with the conductive electrode patterns of a solar cell.

The Ni layer may formed by a plating method using electroplating, electroless plating or LIP (light induced plating). The Cu layer may be formed by a plating method using electroplating, electroless plating or LIP; or a coating method of screen printing, dispenser printing, ink jet printing, roll printing or gravure printing, or spin coating. The Sn layer may be formed by a plating method using electroplating, electroless plating or LIP; or a coating method of screen printing, dispenser printing, ink jet printing, roll printing or gravure printing, or spin coating. The anti-plating layer may be removed by using an acidic, a neutral or an alkaline stripping solution. In addition, the $TiO_2$ layer may have a thickness of about 1 to 20 um and may be formed by a coating method of screen printing, dispenser printing, ink jet printing, roll printing, gravure printing or spin coating. Further, the $TiO_2$ layer may be formed at the front of the substrate or the front of the transparent conductive oxide film except for the area at which a collecting electrode may be formed.

The following examples illustrate the invention and are not intended to limit the same.

Figure 5:
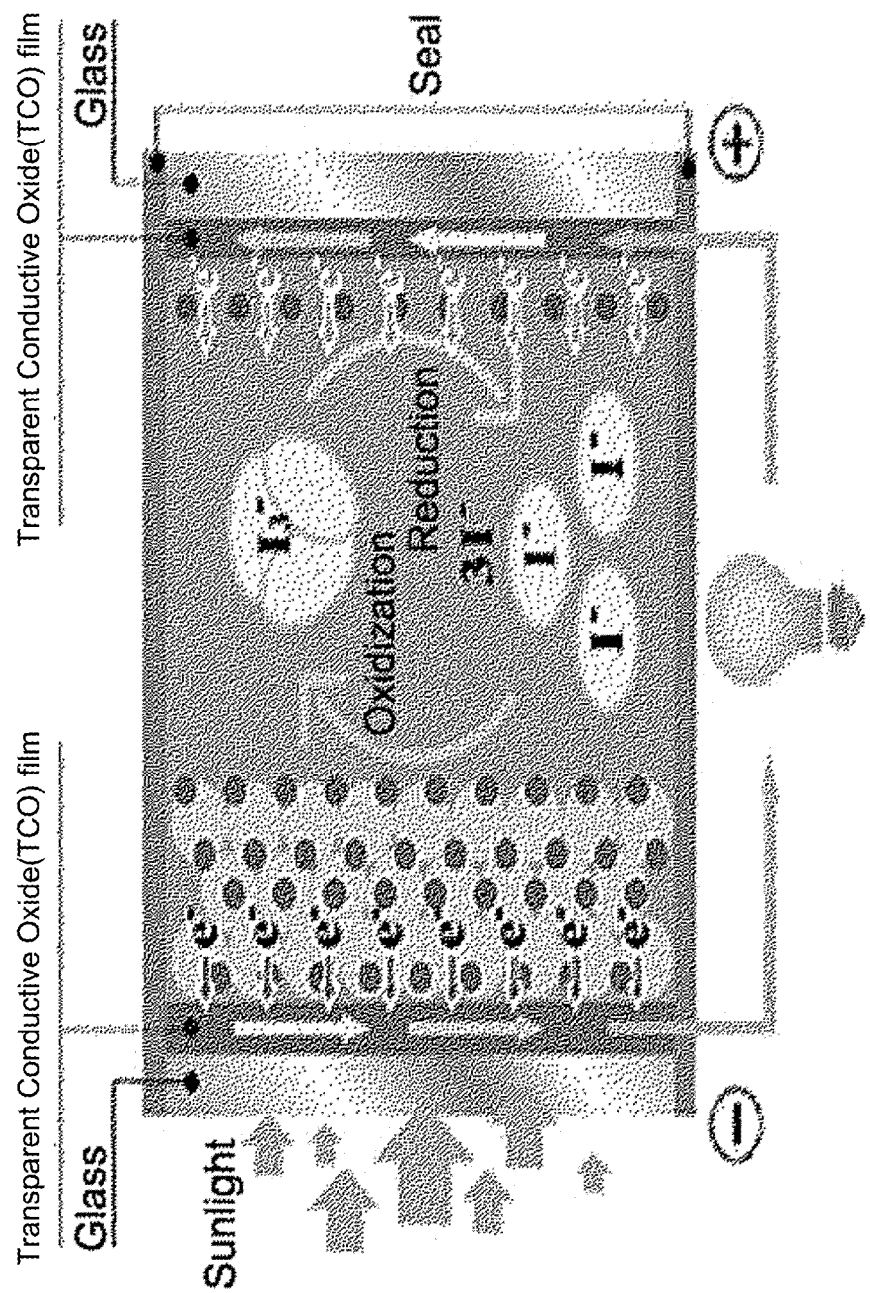
FIG. 5 is an exemplary structure of a dye-sensitized solar cell according to an exemplary embodiment of the present invention.
Figure 6:
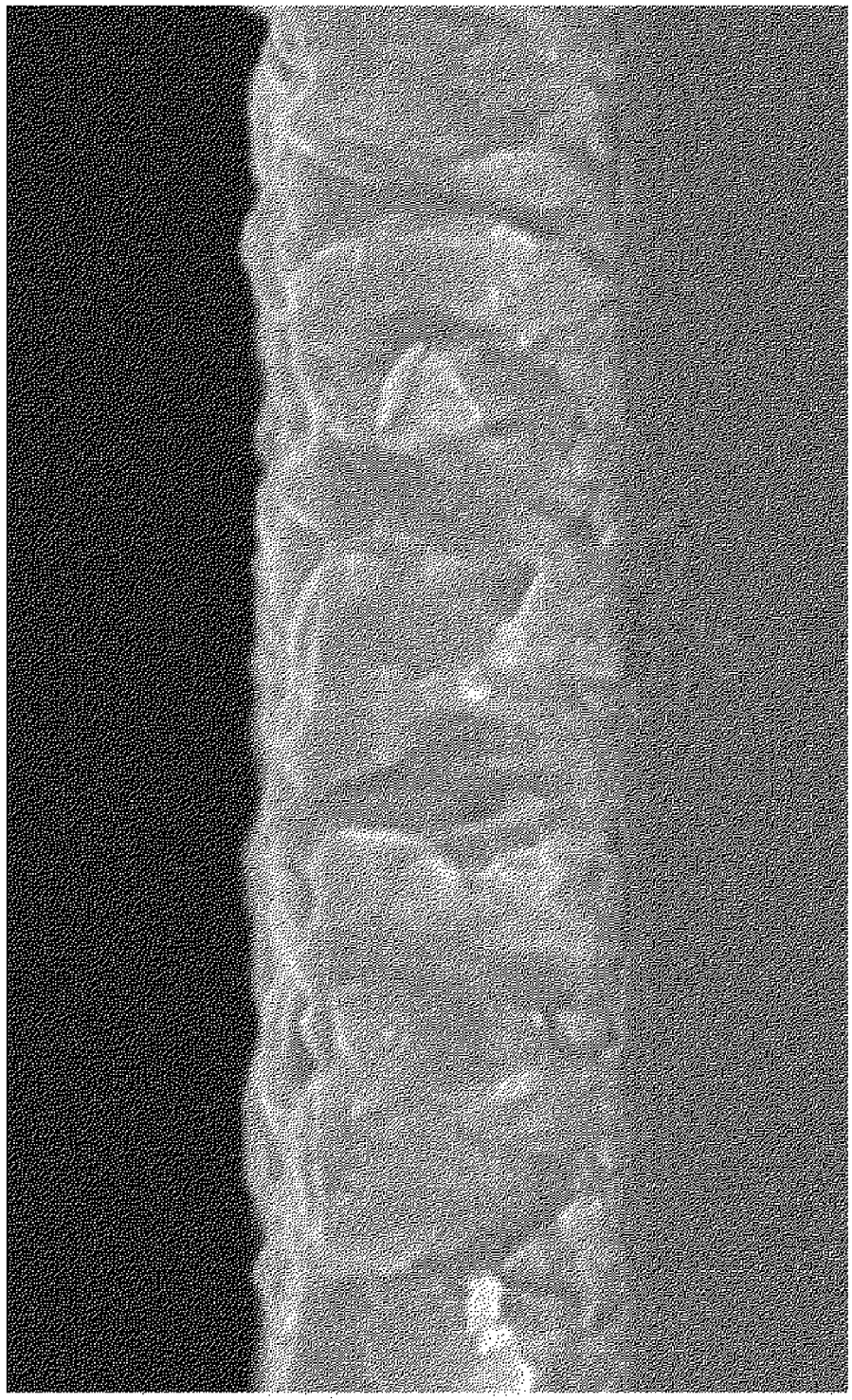
FIG. 6 shows an exemplary transparent conductive oxide film (TCO) formed on a glass substrate according to an exemplary embodiment of the present invention.
Figure 7:
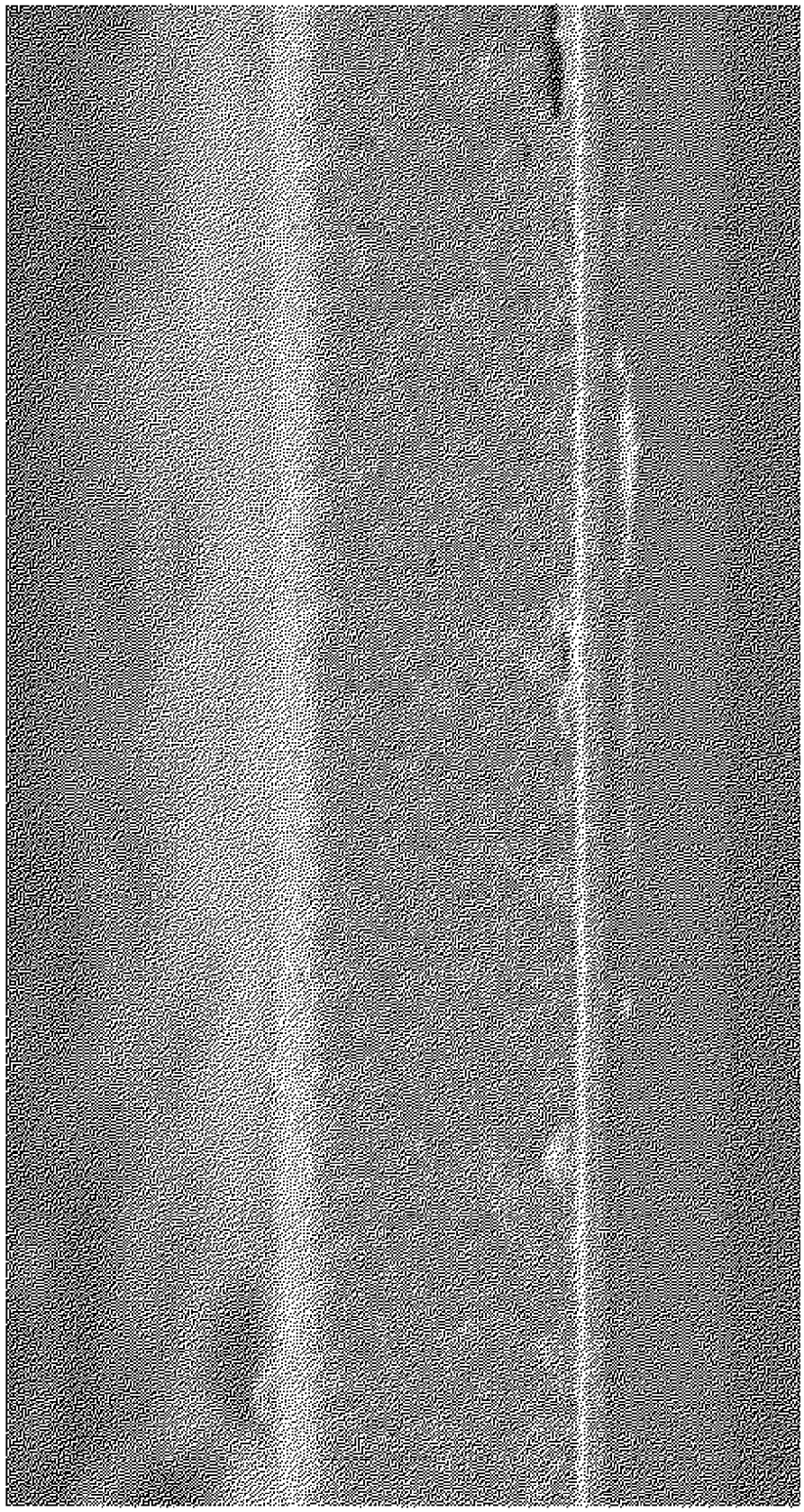
FIG. 7 shows an exemplary $TiO_2$ layer formed on a transparent conductive oxide film (TCO) according to an exemplary embodiment of the present invention.
Figure 8:
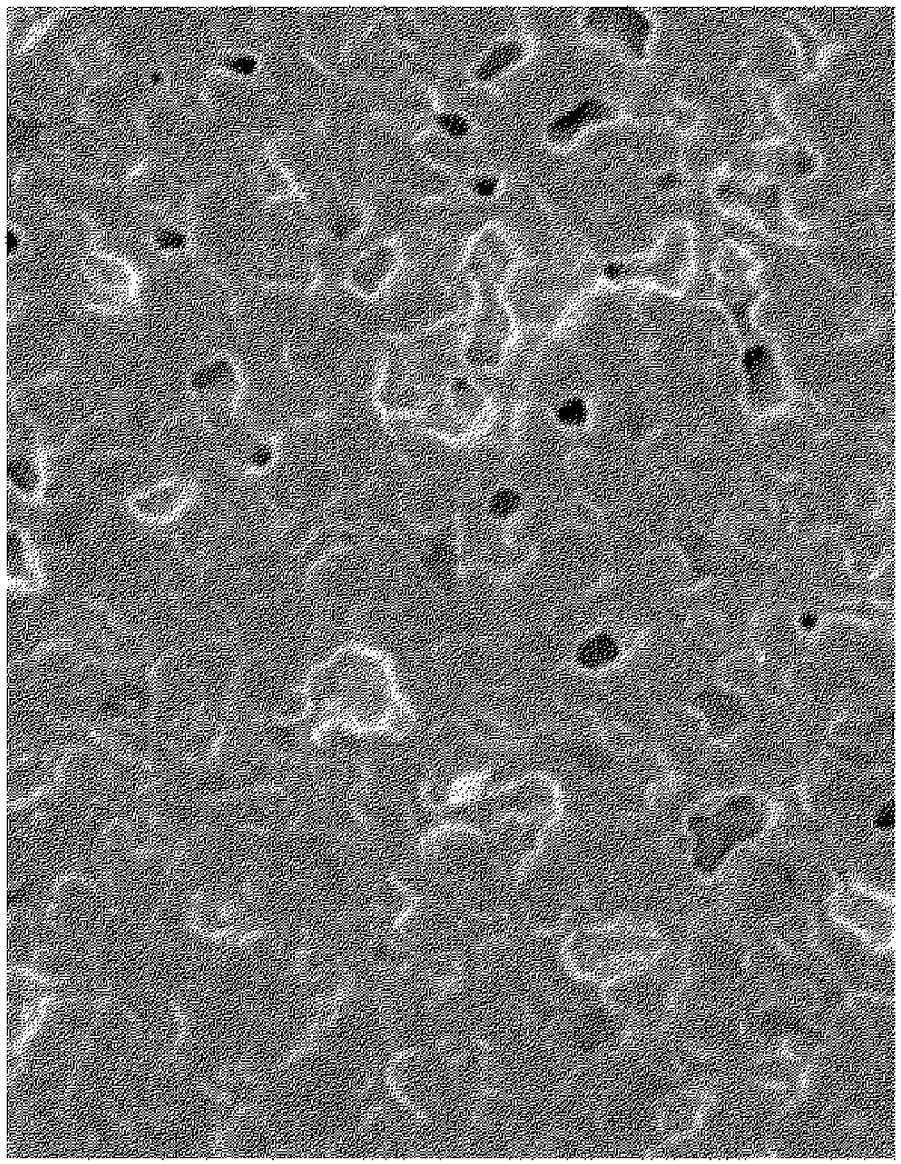
FIG. 8 shows an exemplary Ag layer formed on a transparent conductive oxide film (TCO) according to an exemplary embodiment of the present invention.
Figure 9:
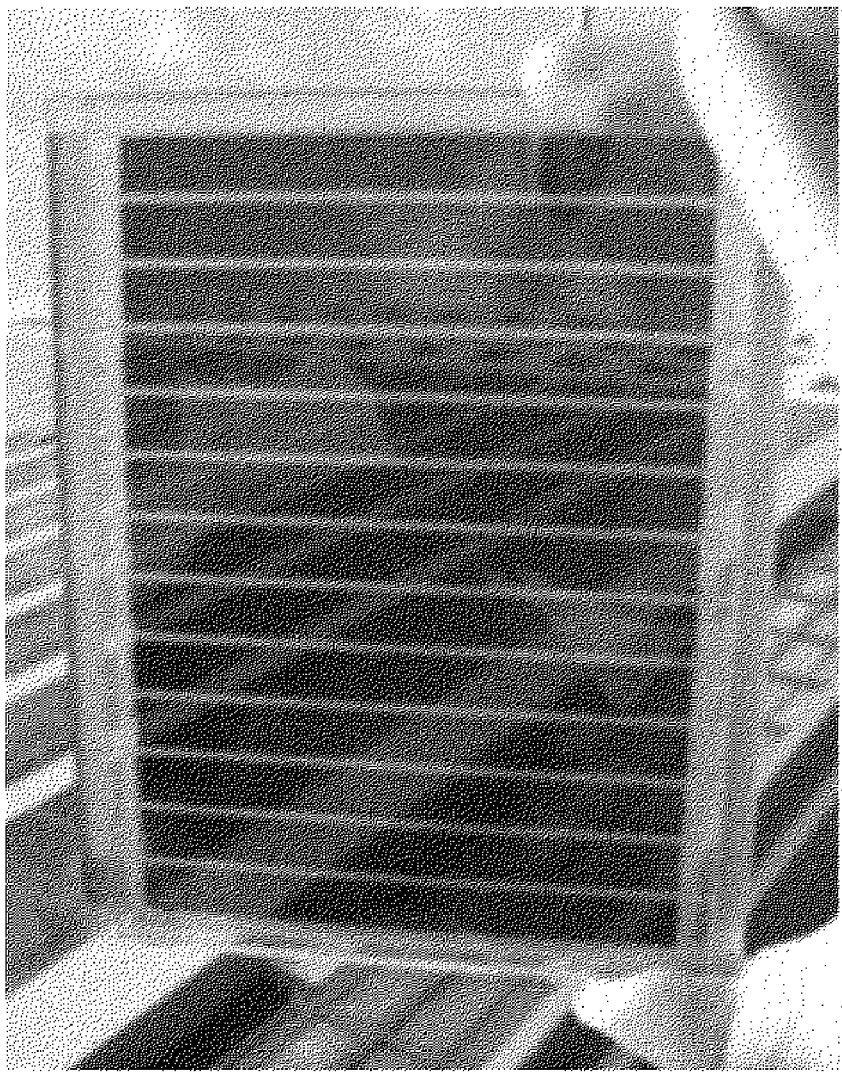
FIG. 9 is an exemplary shape of a dye-sensitized solar cell module according to an exemplary embodiment of the present invention.
Figure 10:
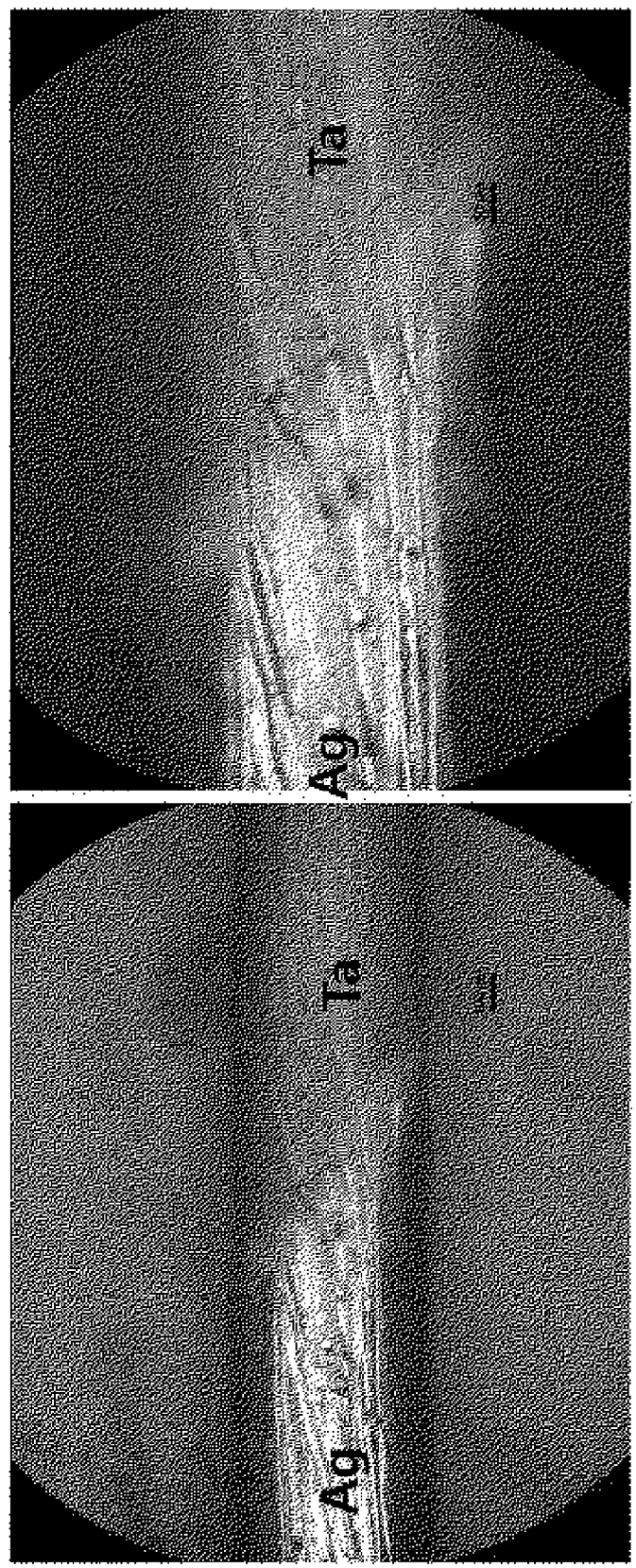
FIG. 10 shows an exemplary Ag—Ta electro-deposited boundary according to an exemplary embodiment of the present invention.

FIG. 5 shows an exemplary elemental structure of a dye-sensitized solar cell, FIG. 6 shows an exemplary TCO formed on the glass substrate, FIG. 7 shows an exemplary $TiO_2$ layer formed on the TCO, FIG. 8 shows an exemplary Ag layer formed on the TCO, FIG. 10 shows an exemplary boundary of electrodeposited Ag—Ta, and FIG. 9 shows an exemplary shape of a dye-sensitized solar cell module fabricated using the above components. The different metals such as Ag—Ta may be electro-deposited in a random order, the anti-painting layer may be optionally formed, and if formed, the anti-painting layer may also be removed.

The dye-sensitized solar cell fabricated according to Examples of the present invention has several advantages of improving a product ion yield through the reduction of substrate breakage, reducing the production costs due to the decrease in the use of Ag, and protecting an Ag layer due to the formation of a different metal thereon. The invention has been described in detail with reference to exemplary embodiments thereof. However, it will be appreciated by those skilled in the art that changes may be made in these embodiments without departing from the principles and spirit of the invention, the scope of which is defined in the accompanying claims and their equivalents.

What is claimed is:

1. A method for manufacturing a solar cell having a different metal layer on a silver electrode as a conductive electrode, comprising:
    preparing a glass substrate;
    forming a transparent conductive oxide film (TCO) on the glass substrate;
    forming an anti-plating layer on the transparent conductive oxide film (TCO) formed on the glass substrate;
    forming a silver (Ag) electrode between the areas of the anti-plating layer;
    forming a nickel (Ni) layer on the Ag electrode;
    forming a copper (Cu) layer on the Ni layer formed on the Ag electrode;
    forming a tin (Sn) layer on the Cu layer formed on the Ni layer formed on the Ag electrode; and
    removing the anti-plating layer,
    wherein the nickel layer formation includes forming a coating of the different metal using the Ag electrode as a seed,
    wherein the Ag electrode has a thickness of 1 to about 20 um, has a bell shape with a bulging upper portion, and is formed by a coating method selected from a group consisting of: screen printing, dispenser printing, ink jet printing, roll printing, gravure printing, and spin coating.

2. The method according to claim 1, further comprising forming a titanium oxide ($TiO_2$) layer on the area where the anti-plating layer is removed.

3. The method according to claim 1, wherein the glass substrate has a thickness of about 1 mm or less.

4. The method according to claim 1, further comprising forming a tantalum (Ta) layer on the Sn layer.

5. The method according to claim 1, wherein the Sn layer formation includes forming a tantalum (Ta) layer on the Cu layer, and forming a Sn layer on the Ta layer.

6. The method according to claim 1, wherein the transparent conductive oxide film has a thickness of about 1000 A or less and includes at least one layer selected from a group consisting of fluorine tin oxide, indium tin oxide, indium zinc oxide, indium tungsten oxide and ZnO.

7. The method according to claim 1, wherein the transparent conductive oxide film has a metal mesh pattern.

8. The method according to claim 1, wherein the anti-plating layer is formed by using ink jet printing, screen printing, roll printing or gravure printing, followed by being hardened through ultraviolet (UV) curing or heat curing.

9. The method according to claim 1, wherein the anti-painting layer is formed in a pattern at an area that excludes the Ag electrode.

10. The method according to claim 1, wherein the anti-plating layer is formed using a coating method of gravure printing or spin coating.

11. The method according to claim 2, wherein the $TiO_2$ layer functions as an anti-plating layer.

12. The method according to claim 1, wherein the Ag electrode formation is performed prior to the anti-plating layer formation.

13. The method according to claim 1, wherein the surface of the transparent conductive oxide film is coated with a Fluoro-based liquid material or is subjected to plasma pre-treatment with Fluoro-based gas prior to the formation of an Ag electrode.

14. The method according to claim 1, further comprising forming a plurality of patterns for plating at a bus line in a bottom surface during the formation of the Ag electrode.

15. The method according to claim 1, wherein the Ag electrode formation is performed by a plating method using electroplating, electroless plating or LIP (light induced plating).

16. The method according to claim 1, wherein the Cu layer formation is performed by a plating method using electroplating, electroless plating or LIP; or a coating method of screen printing, dispenser printing, ink jet printing, roll printing or gravure printing, or spin coating.

17. The method according to claim 1, wherein the Sn layer formation is formed by a plating method using electroplating, electroless plating or LIP; or a coating method of screen printing, dispenser printing, ink jet printing, roll printing or gravure printing, or spin coating.

18. The method according to claim 1, wherein the anti-plating layer is removed using an acidic, a neutral or an alkaline stripping solution.

19. The method according to claim 2, wherein the $TiO_2$ layer has a thickness of about 1 to 20 um and is formed by a coating method selected from a group consisting of: screen printing, dispenser printing, ink jet printing, roll printing, gravure printing, and spin coating.

20. The method according to claim 2, wherein the TiO$_2$ layer is formed at the front of the substrate or the front of the transparent conductive oxide film except for the area at which a collecting electrode is formed.

21. The method according to claim 1, wherein the Ag electrode is a tantalum (Ta) plated Ag electrode.

22. The method according to claim 1, wherein the solar cell having the different metal layer on the silver electrode as the conductive electrode manufactured by the method is used to manufacture a semi-transparent solar cell module for a panorama roof.

23. The method according to claim 1, wherein the solar cell having the different metal layer on the silver electrode as the conductive electrode manufactured by the method is used to manufacture a dye-sensitized solar cell.

* * * * *